(12) United States Patent
Takiar et al.

(10) Patent No.: US 8,294,251 B2
(45) Date of Patent: Oct. 23, 2012

(54) STACKED SEMICONDUCTOR PACKAGE WITH LOCALIZED CAVITIES FOR WIRE BONDING

(75) Inventors: Hem Takiar, Fremont, CA (US);
Shrikar Bhagath, San Jose, CA (US);
Cheemen Yu, Fremont, CA (US);
Chih-Chin Liao, Changhua (TW)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 12/165,320

(22) Filed: Jun. 30, 2008

(65) Prior Publication Data
US 2009/0321950 A1 Dec. 31, 2009

(51) Int. Cl.
*H01L 23/02* (2006.01)
(52) U.S. Cl. ...................... 257/686; 257/777
(58) Field of Classification Search .............. 257/686, 257/777
See application file for complete search history.

(56) References Cited

U.S. PATENT DOCUMENTS

| | | | |
|---|---|---|---|
| 5,019,943 A | 5/1991 | Fassbender et al. | |
| 5,804,004 A | 9/1998 | Tuckerman et al. | |
| 6,326,689 B1 | 12/2001 | Thomas | |
| 6,351,028 B1 * | 2/2002 | Akram | 257/686 |
| 6,777,797 B2 * | 8/2004 | Egawa | 257/686 |
| 7,115,483 B2 | 10/2006 | Kwon et al. | |
| 7,183,622 B2 | 2/2007 | Heck et al. | |
| 7,309,623 B2 | 12/2007 | Tan et al. | |
| 7,327,020 B2 * | 2/2008 | Kwon et al. | 257/686 |
| 7,675,153 B2 | 3/2010 | Kurosawa et al. | |
| 2006/0175697 A1 | 8/2006 | Kurosawa et al. | |

FOREIGN PATENT DOCUMENTS

| | | |
|---|---|---|
| JP | 2005101106 A | 4/2005 |
| JP | 2006216692 A | 8/2006 |

OTHER PUBLICATIONS

Cheung, "Dicing Die Attach Films for High Volume Stacked Die Application", 2006 Electronic Components and Technology Conference.
Koyanagi et al., "Three-Dimensional Integration Technology Based on Wafer Bonding With Vertical Buried Interconnections", 2006 IEEE.
Response to Office Action filed May 5, 2010 in U.S. Appl. No. 12/165,297.
Office Action dated Mar. 5, 2010 in U.S. Appl. No. 12/165,297.
Office Action dated Jul. 19, 2010 in U.S. Appl. No. 12/165,297.
Office Action dated Dec. 20, 2010, Korean Patent Application No. 59426/2009.

(Continued)

*Primary Examiner* — Howard Weiss
*Assistant Examiner* — Tifney Skyles
(74) *Attorney, Agent, or Firm* — Vierra Magen Marcus & DeNiro LLP

(57) ABSTRACT

A semiconductor die and a low profile semiconductor package formed therefrom are disclosed. The semiconductor package may include at least first and second stacked semiconductor die mounted to a substrate. The first and/or second semiconductor die may be fabricated with localized cavities through a bottom surface of the semiconductor die, along a side edge of the semiconductor die. The one or more localized cavities in a side take up less than the entire side. Thus, the localized cavities allow low height stacking of semiconductor die while providing each die with a high degree of structural integrity to prevent cracking or breaking of the die edge during fabrication.

20 Claims, 8 Drawing Sheets

OTHER PUBLICATIONS

English Abstract and Computer Translation of JP2005101106 published Apr. 14, 2005.
English Abstract and Computer Translation of JP2006216692 published Aug. 17, 2006.
Response to Office Action filed Jan. 19, 2011, U.S. Appl. No. 12/165,297.
Office Action dated Jan. 27, 2011, Chinese Patent Application No. 200910151524.X.
Final Office Action dated Apr. 12, 2011, U.S. Appl. No. 12/165,297.
Response to Office Action filed Mar. 18, 2011, Korean Patent Application No. 59426/2009.
Office Action mailed Oct. 4, 2011, U.S. Appl. No. 12/165,297.
Response to Office Action filed Aug. 5, 2011, Chinese Patent Application No. 200910151524.X.
Response to Final Office Action filed Jul. 12, 2011, U.S. Appl. No. 12/165,297.
Response to Office Action mailed Mar. 5, 2012 in U.S. Appl. No. 12/165,297.
Final Office Action mailed May 29, 2012 in U.S. Appl. No. 12/165,297.
Office Action and Search Report dated Jul. 27, 2012 in Taiwan Patent Application No. 098122072.

* cited by examiner

Fig. 14
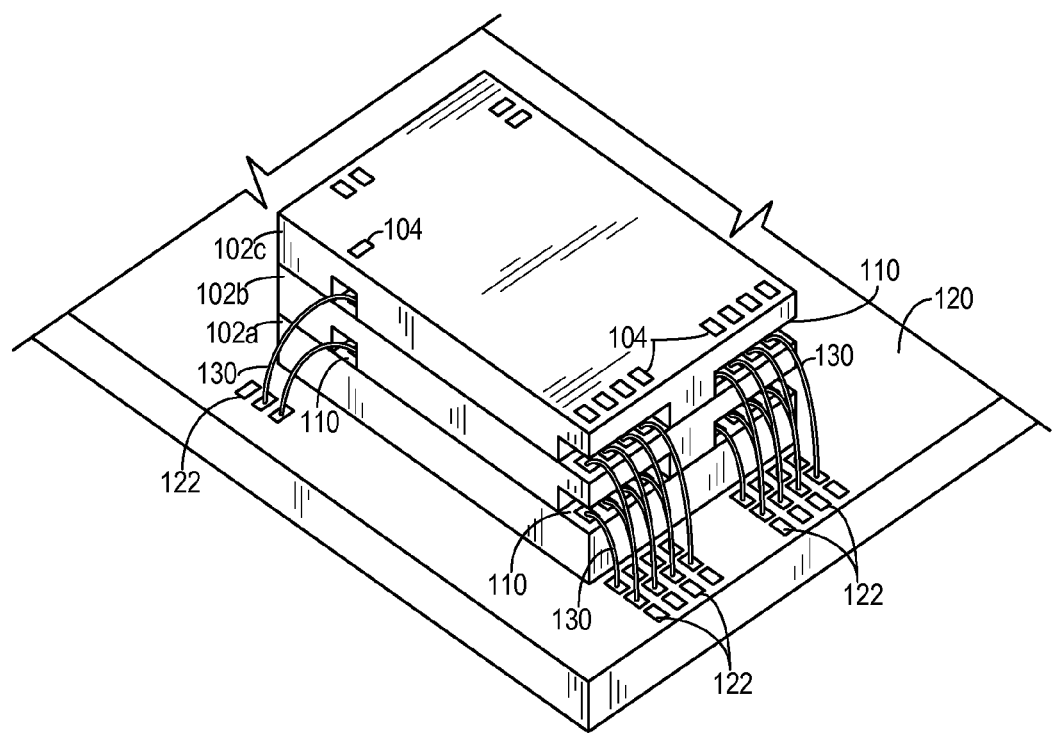
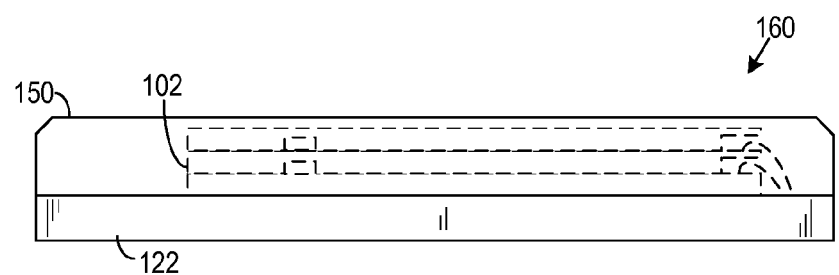
Fig. 15

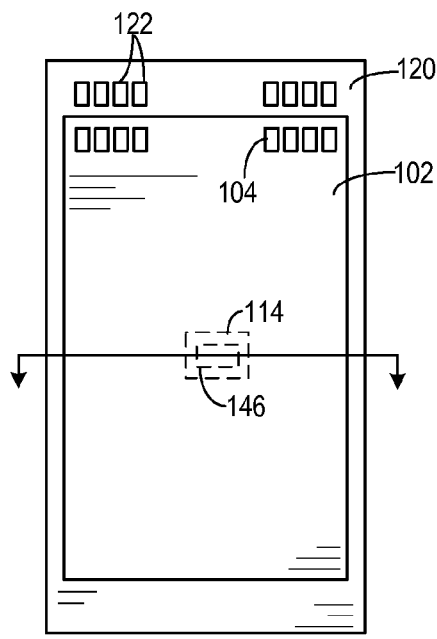
Fig. 20
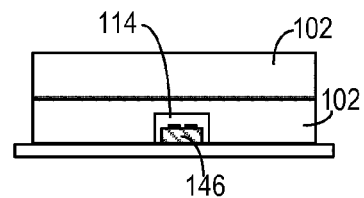
Fig. 21
Fig. 22
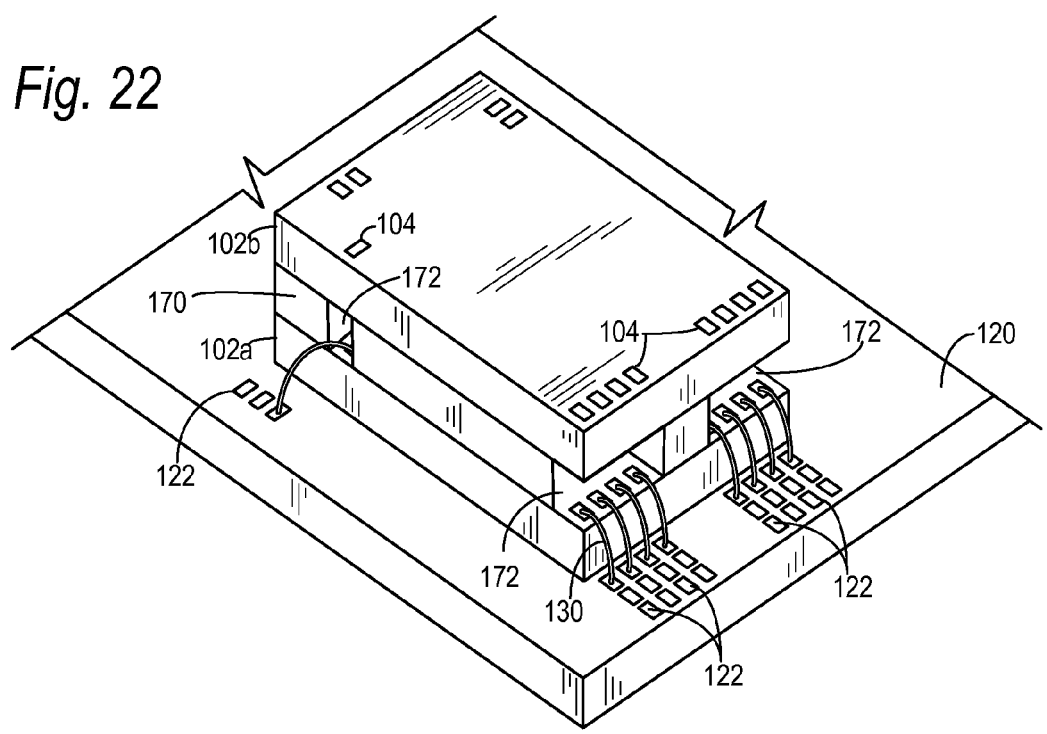

STACKED SEMICONDUCTOR PACKAGE WITH LOCALIZED CAVITIES FOR WIRE BONDING

CROSS-REFERENCE TO RELATED APPLICATION

The following application is cross-referenced and incorporated by reference herein in its entirety:

U.S. patent application Ser. No. 12/165,297, entitled "Method of Fabricating Stacked Semiconductor Package with Localized Cavities For Wire Bonding," by Takiar, et al., filed on even date herewith.

BACKGROUND OF THE INVENTION

1. Field of the Invention

Embodiments of the present invention relate to a low profile semiconductor device and method of fabricating same.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While a wide variety of packaging configurations are known, flash memory storage cards may in general be fabricated as system-in-a-package (SiP) or multichip modules (MCM), where a plurality of die are mounted on a substrate in a stacked configuration. An edge view of a conventional semiconductor package 20 (without molding compound) is shown in prior art FIGS. 1 and 2. Typical packages include a plurality of semiconductor die 22, 24 mounted to a substrate 26. Although not shown in FIGS. 1 and 2, the semiconductor die are formed with die bond pads on an upper surface of the die. Substrate 26 may be formed of an electrically insulating core sandwiched between upper and lower conductive layers. The upper and/or lower conductive layers may be etched to form conductance patterns including electrical leads and contact pads. Wire bonds are soldered between the die bond pads of the semiconductor die 22, 24 and the contact pads of the substrate 26 to electrically couple the semiconductor die to the substrate. The electrical leads on the substrate in turn provide an electrical path between the die and a host device. Once electrical connections between the die and substrate are made, the assembly is then typically encased in a molding compound to provide a protective package.

It is known to layer semiconductor die on top of each other either with an offset (prior art FIG. 1) or in a stacked configuration (prior art FIG. 2). In the offset configuration of FIG. 1, the die are stacked with an offset so that the bond pads of the next lower die are left exposed. Such configurations are shown for example in U.S. Pat. No. 6,359,340 to Lin, et al., entitled, "Multichip Module Having A Stacked Chip Arrangement." An offset configuration provides an advantage of convenient access of the bond pads on each of the semiconductor die. However, the offset requires a greater footprint on the substrate, where space is at a premium.

In the stacked configuration of FIG. 2, two or more semiconductor die are stacked directly on top of each other, thereby taking up less footprint on the substrate as compared to an offset configuration. However, in a stacked configuration, space must be provided between adjacent semiconductor die for the bond wires 30. In addition to the height of the bond wires 30 themselves, additional space must be left above the bond wires, as contact of the bond wires 30 of one die with the next die above may result in an electrical short. As shown in FIG. 2, it is therefore known to provide a dielectric spacer layer 34 to provide enough room for the wire bond 30 to be bonded to the die bond pad on the lower die 24.

Referring now to prior art FIGS. 3 and 4, instead of a spacer layer 34, it is also known to etch a trench 40 along an edge of the bottom (inactive) surface 42 of an upper die, such as die 22. The trench 40 allows two die to be stacked directly on top of one another, without a spacer layer, while still having space for a wire bond 30 off of the lower die. As seen in FIG. 4, the trench 40 has conventionally been formed along an entire edge of a die. An example of a trench formed along an entire edge is seen for example in U.S. Pat. No. 7,309,623 to Tan, which shows a trench having vertical and horizontal sidewalls (as is also shown in prior art FIG. 4). A further example of a trench formed along an entire edge is seen for example in U.S. Pat. No. 5,804,004 to Tuckerman et al., which shows a trench having an angled or beveled sidewall. Both of these patents are incorporated by reference herein.

One disadvantage to prior art semiconductor packages including a trench along an entire edge is that the formation of the trench structurally weakens the semiconductor die. Namely, where a trench leaves only a thin amount of material above the trench, the die may crack or break above the trench. This may be especially true during the encapsulation process, where large forces are exerted on the semiconductor die in order to properly encase the die in the molding compound.

SUMMARY OF THE INVENTION

Embodiments of the present invention relate to a semiconductor die and a low profile semiconductor package formed therefrom including at least first and second stacked semiconductor die mounted to a substrate. The first and/or second semiconductor die may be fabricated with localized cavities through a bottom surface of the semiconductor die, along a side edge of the semiconductor die. A given side of the semiconductor die may include no localized cavities, or one or more localized cavities. Where a side of the die includes one or more localized cavities, the localized cavities take up less than the entire side.

When assembled into a die stack on a substrate, the wire bonds off of a first semiconductor die are received within the localized cavities of the semiconductor die mounted on top of the first die. Thus, die may be stacked directly on top of each other without the wire bonds from the first die electrically shorting against the semiconductor die mounted on the first die. As the cavities are localized, and do not take up an entire side of a die, the localized cavities allow low height stacking of semiconductor die while providing each die with a high degree of structural integrity to prevent cracking or breaking of the die edge during fabrication.

In embodiments, the positions of the localized cavities in the bottom surface of a die correspond to the positions of the die bond pads in the top surface of the die. Thus, a plurality of such semiconductor die may be stacked atop each other, with the bond pads, and wire bonds extending therefrom, aligning within the localized cavities of the next higher semiconductor die in the stack.

A semiconductor die may also include a localized cavity spaced inward from each of the sides of the semiconductor die. In embodiments including such a localized cavity, a component such as a passive component or a secondary semiconductor die may be mounted on the surface beneath the localized cavity and received within the localized cavity. The cavity serves to isolate the component from the die including the cavity. Such a configuration increases the flexibility of where components may be mounted, for example on the substrate.

DESCRIPTION OF THE DRAWINGS

FIG. 14 is a perspective view of a semiconductor device during fabrication including wire bonds positioned within the localized cavity of the next adjacent semiconductor die.

FIG. 15 is an edge view of a finished semiconductor device according to an embodiment of the present invention.

FIG. 20 is a top view of a semiconductor device according to an alternative embodiment including a localized cavity within a central portion of the semiconductor die.

FIG. 21 is a cross-sectional view of the semiconductor device according to the alternative embodiment of FIG. 20.

FIG. 22 is a perspective view of an alternative embodiment showing a semiconductor device during fabrication including wire bonds positioned within localized cavities of a spacer layer between semiconductor die.

DETAILED DESCRIPTION

Embodiments will now be described with reference to FIGS. 5 through 22, which relate to a low profile semiconductor package. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom" and "upper" and "lower" are used herein for convenience and illustrative purposes only, and are not meant to limit the description of the invention inasmuch as the referenced item can be exchanged in position.

A process for forming semiconductor die in accordance with the present invention will now be described with reference to the flowchart of FIG. 5, and the various top and perspective views of FIGS. 6 through 12. FIG. 6 shows a top view of a semiconductor wafer 100 for batch processing a plurality of semiconductor die 102 (one of which is labeled in FIG. 6). Each die 102 may be formed with bond pads 104 as shown for example in the enlarged view of die 102 in FIGS. 7 and 8. Bond pads 104 are used to electrically couple the semiconductor die 102 to another semiconductor die, or to a printed circuit board, leadframe or other substrate as explained hereinafter. While bond pads 104 are shown along all edges of die 102 in FIGS. 7 and 8, it is understood that the bond pads 104 may be formed along one edge, two opposed or adjacent edges or three edges in further embodiments. It is understood that the number of bond pads 104 along a given edge of the semiconductor die 102 may be more or less than is shown in the figures.

Figure 1:
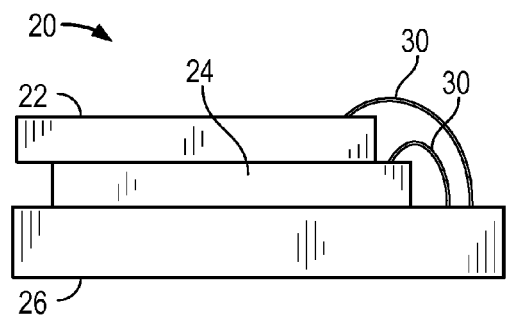
FIG. 1 is a prior art edge view of a conventional semiconductor device including a pair of semiconductor die stacked in an offset relation.
Figure 2:
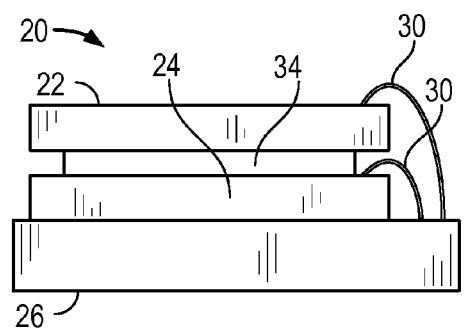
FIG. 2 is a prior art edge view of a conventional semiconductor device including a pair of semiconductor die stacked in an overlapping relation and separated by a spacer layer.
Figure 3:
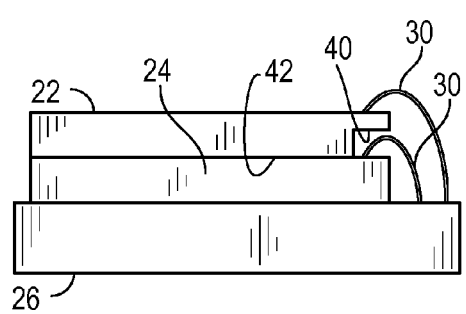
FIG. 3 is a prior art edge view of a conventional semiconductor device including a pair of semiconductor die stacked in an overlapping relation with the upper die including a trench along a lower edge of the semiconductor die.
Figure 4:
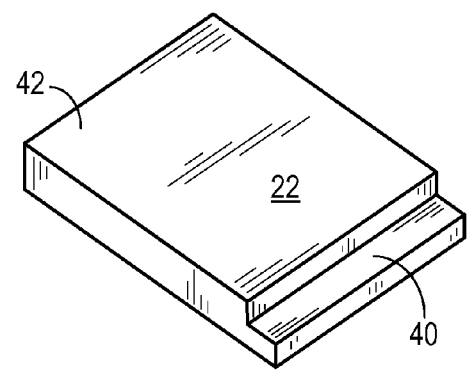
FIG. 4 is a prior art bottom perspective view of a conventional semiconductor die with a trench as shown in FIG. 3.
Figure 5:
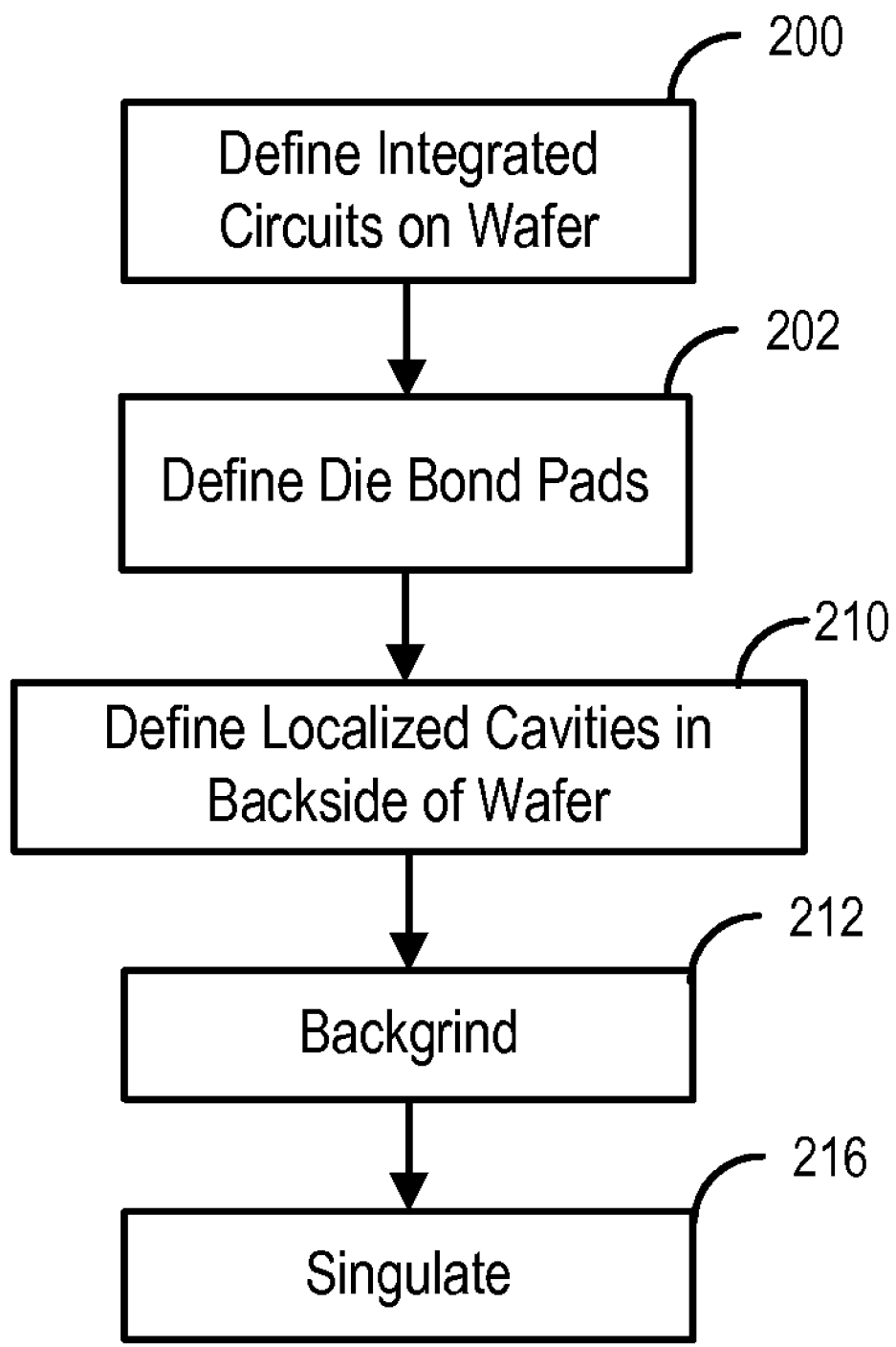
FIG. 5 is a flowchart for forming a semiconductor die according to embodiments of the present invention.
Figure 6:
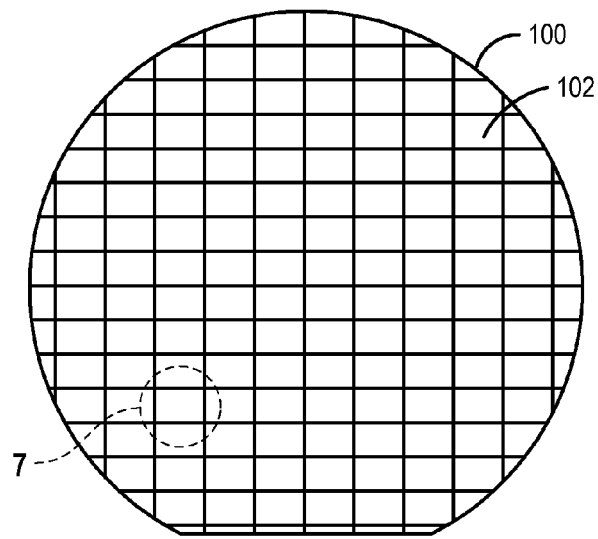
FIG. 6 is a top view of a semiconductor wafer from which a plurality of semiconductor die according to embodiments of the present invention may be fabricated.
Figure 7:
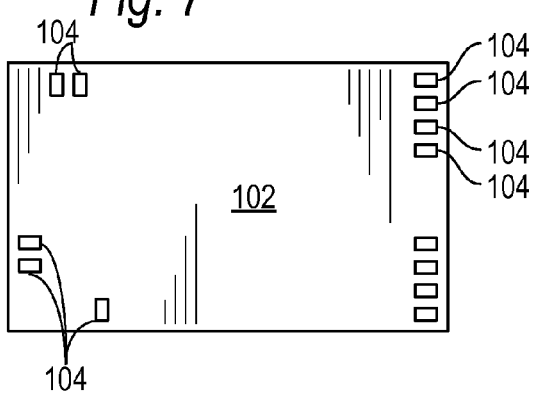
FIG. 7 is a top view of a semiconductor die during fabrication.
Figure 8:
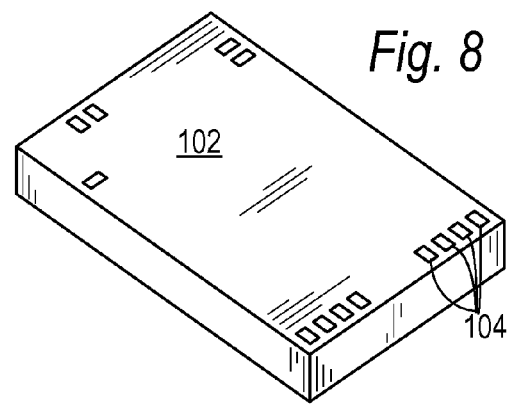
FIG. 8 is a perspective view of the semiconductor die of FIG. 7 during fabrication.
Figure 9:
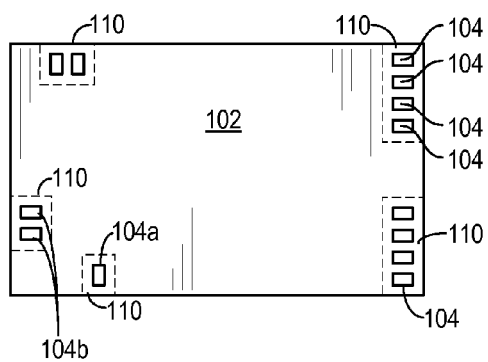
FIG. 9 is a top view of a semiconductor die including localized cavities formed in a bottom surface of the semiconductor die.

Referring now to the flowchart of FIG. 5, the integrated circuit components of semiconductor die 102 may be formed on wafer 100 in step 200 by known processes such as film deposition, photolithography, patterning, and diffusion of impurities. Die bond pads 104 may be formed in respective die in step 202 by known processes including but not limited to plating, evaporation, screen printing, or various deposition processes.

In accordance with the present invention, localized cavities may next be formed in the back (inactive) surface of the die 102 on wafer 100 in step 210. Such localized cavities 110 are seen for example in phantom in the top view of FIG. 9 and in the bottom perspective view of FIG. 10. The localized cavities 110 may be formed by a variety of known processes, including for example chemical wet etch, dry etch, laser ablation or other chemical or mechanical means which controllably remove portions of the back surface of the die 102. In order to fabricate the localized cavities, the top (active) surface of the wafer 100 may be secured to a chuck so that one of the above-described processes may be performed on the back surface to define the localized cavities for each semiconductor die in the wafer 100.

The positions of the localized cavities 110 in the bottom surface of the die 102 correspond to the positions of the wire bond pads 104 in the top surface of the die 102. That is, the localized cavities 110 are formed on the bottom surface of the die 102, directly beneath the bond pads 104 on the top surface of the die 102. As explained hereinafter in greater detail, a plurality of die having the same configuration of die bond pads 104 and localized cavities 110 may be stacked directly on top of each other, without a spacer layer, and the localized cavities 110 allow wire bonding of lower die without electrical shorting of the wires bond against the next upper die.

The length dimension of each localized cavity 110 may vary, but may in general be slightly larger than the grouping of contact pads formed thereabove on the opposite surface of the die. Thus, the length of a localized cavity 110 beneath a single contact pad (such as contact pad 104*a*) may be smaller than the length of a localized cavity 110 beneath a plurality of contact pads (such as contact pads 104*b*). It is understood that all localized cavities may have the same length (for example the length of the largest grouping of contact pads 104) in alternative embodiments.

Figure 10:
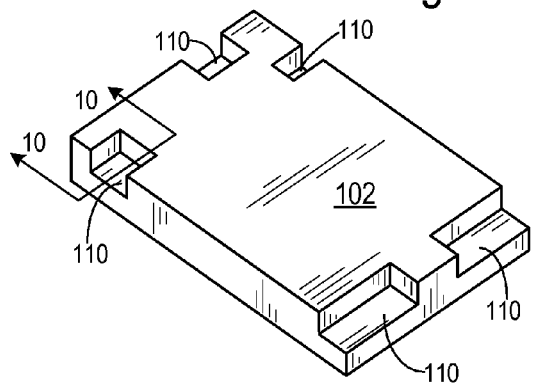
FIG. 10 is a bottom perspective view of the semiconductor die of FIG. 9 including localized cavities formed in a bottom surface of the semiconductor die.
Figure 10A:
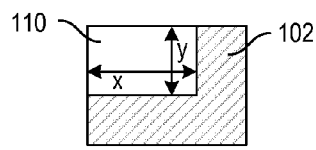
FIG. 10A is a cross-sectional view through line 10-10 in FIG. 10.
Figure 10B:
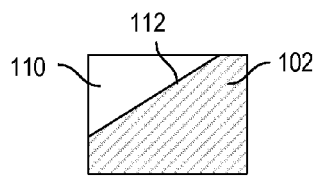
FIG. 10B is a cross-sectional view of an alternative embodiment of a localized cavity seen from the same perspective as FIG. 10A including a beveled surface.

FIG. 10A shows a cross-sectional view through line 10-10 in FIG. 10. The horizontal depth dimension, x, of each localized cavity 110 perpendicular to an edge of a die 102, and the vertical depth dimension, y, of each localized cavity 110 perpendicular to the lower surface of a die 102, may vary in alternative embodiments. However, the horizontal and vertical depth dimensions of each localized cavity may be sufficient to allow one or more wire bonds to be connected to a first semiconductor die 102 and positioned within the localized cavities 110 of a second semiconductor die 102 mounted on the first die without contacting the second die 102. Instead of having horizontal and vertical surfaces, any localized cavity 110 may instead be defined in part by an angled or beveled surface 112 forming an oblique angle with a bottom surface of the die 102, such as shown in FIG. 10B (seen from the same perspective as the cross-section of FIG. 10A).

As seen in the figures, the cavities 110 are localized. That is, no cavity 110 extends along an entire length of an edge of a die 102. Where a side includes a number of localized cavities, the localized cavities together in the side are less than the overall length of the side. Thus, the localized cavities 110 allow low height stacking of semiconductor die while providing each die with a high degree of structural integrity to prevent cracking or breaking of the die edge during fabrication.

Figure 11:
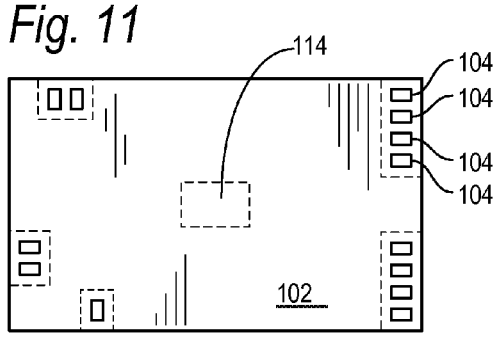
FIG. 11 is an edge view of a semiconductor die including a localized cavity buried within a center portion of the bottom surface of the semiconductor die.
Figure 12:
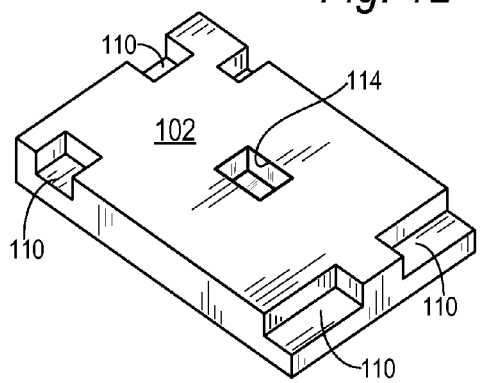
FIG. 12 is a bottom perspective view of the semiconductor die of FIG. 11 including a localized cavity formed within a center portion of the bottom surface of the semiconductor die.

Referring to the top view of FIG. 11 and the bottom perspective view of FIG. 12, in addition to or instead of the localized cavities 110 along one or more edges of the die 102, a localized cavity 114 may be formed within an interior of the die 102. That is, a cavity 114 may be formed down into the back surface of the die 102 and spaced from each of the edges of die 102. As explained in greater detail below, such cavities 114 in a semiconductor die may be used to receive passives or secondary die that are mounted on a surface beneath the semiconductor die. The surface may be that of a lower die or a substrate.

In a step 212, a backgrind process may be performed on the back (inactive) surface of wafer 100 as is known in the art to thin the die 102 to the desired thickness. Although a single die 102 is shown in FIGS. 7 through 12, the above-described steps are performed on all of the die 102 while still on the wafer 100. In step 216, each of the processed die may be singulated from wafer 100. Typically only memory die are stacked atop each other within a semiconductor package, so die 102 may typically be memory die such as flash memory. However, it is understood that the type of semiconductor die formed as described above may vary.

A process for forming a semiconductor package in accordance with the present invention using the semiconductor die 102 described above will now be explained with reference to the flowchart of FIG. 13, and the various views of FIGS. 14 through 21. Referring initially to FIG. 14, first semiconductor die 102*a* may be mounted on a substrate 120 in a step 300. The die 102*a* may be mounted to substrate 120 via a die attach adhesive in a known adhesive or eutectic die bond process. The die 102*a* shown in FIG. 14 does not include localized cavities 110 (because die 102*a* is the bottom die). Although unnecessary, die 102*a* may include localized cavities 110 in alternative embodiments, for example where the bottom die 102*a* is processed from a wafer in the same manner as the other die in the die stack which include localized cavities 110.

Although not shown, substrate 120 may be part of a panel of substrates so that the semiconductor packages according to the present invention may be batch processed for economies of scale. Although fabrication of a single semiconductor package is described below, it is understood that the following description may apply to all packages formed on the substrate panel. The substrate 120 may be a variety of different chip carrier mediums, including a PCB, a leadframe or a tape automated bonded (TAB) tape. Where substrate 120 is a PCB, the substrate may be formed of a core having top and/or bottom conductive layers formed thereon. The core may be various dielectric materials such as for example, polyimide laminates, epoxy resins including FR4 and FR5, bismaleimide triazine (BT), and the like.

The conductive layers may be formed of copper or copper alloys, plated copper or plated copper alloys, Alloy 42 (42FE/58NI), copper plated steel or other metals or materials known for use on substrates. The conductive layers may be etched into a conductance pattern as is known for communicating signals between the semiconductor die 102 and an external device (not shown). Substrate 120 may additionally include exposed metal portions forming contact pads 122 on an upper surface of the substrate 120. Where the semiconductor package is a land grid array (LGA) package, contact fingers (not shown) may also be defined on a lower surface of the substrate 120. The contact pads 122 and/or contact fingers may be plated with one or more gold layers, for example in an electroplating process as is known in the art.

After semiconductor die 102*a* is affixed to substrate 120 in step 200, wire bonds 130 may be attached between die bond pads 104 on die 102*a* and contact pads 122 on substrate 120 in a step 302. The wire bonds 130 may be formed in a known wire bond process such as for example forward or reverse ball bonding. In the embodiments shown in the figures, wire bonds 130 would be provided along all four edges of die 102*a*, but it is understood that one or more edges of die 102*a* may not include bond pads 104 or wire bonds 130 in further embodiments.

In accordance with the present invention, the localized cavities 110 allow multiple semiconductor die to be stacked in a completely overlapping relation, without having to space the overlapping die with a spacer layer or the like. Accordingly, in step 310, a second semiconductor die 102*b* may be affixed atop semiconductor die 102*a* using a known die attach adhesive. When the die 102*b* is mounted atop die 102*a*, the wire bonds 130 from the bottom die 102a fit within the localized cavities 110 on the underside of the die 102b. Thus, the wire bonds 130 from the die 102a do not contact or electrically short against die 102b. In this manner, the localized cavities allow die 102b to be mounted directly atop die 102a without the use of a spacer layer. In step 312, die 102b may be wire bonded to the substrate 120 with a second set of wire bonds 130 in a manner similar to that described above.

Figure 13:
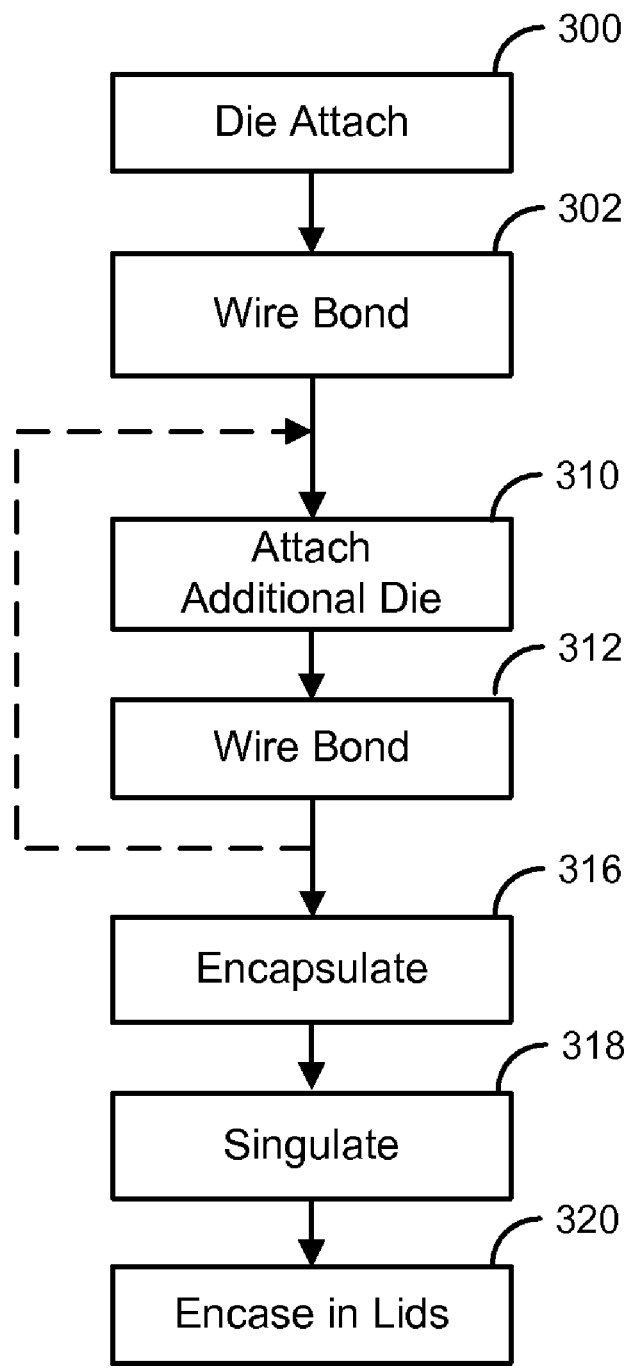
FIG. 13 is a flowchart showing the fabrication of a semiconductor device according to the present invention.
Figure 16:
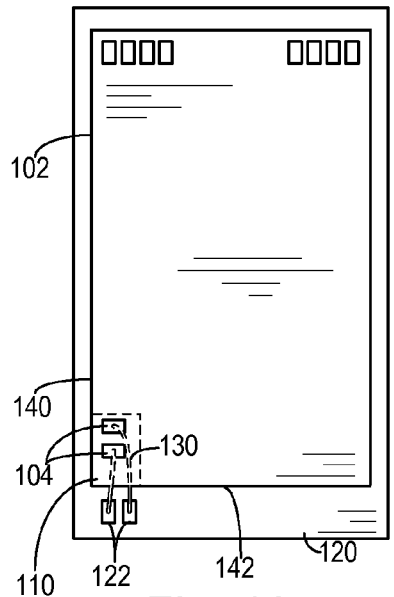
FIG. 16 is a top view including a localized cavity and wire bond configuration according to an alternative embodiment of the present invention.
Figure 17:
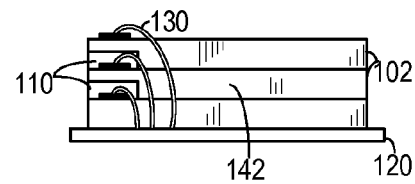
FIG. 17 is an end view of the semiconductor device according to the alternative embodiment of FIG. 16.
Figure 18:
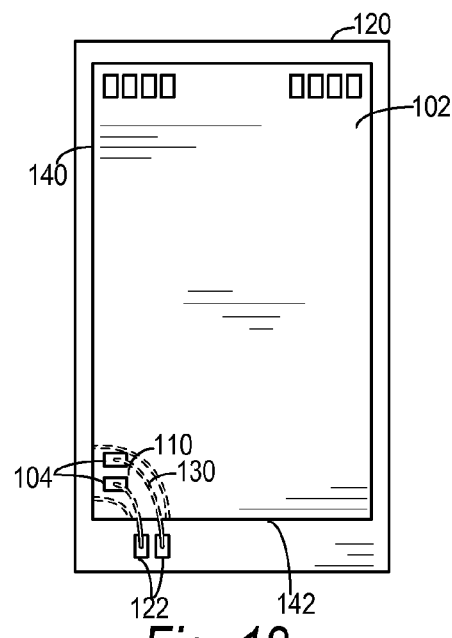
FIG. 18 is a top view including a localized cavity and wire bond configuration according to a further alternative embodiment of the present invention.
Figure 19:
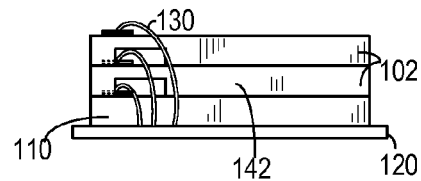
FIG. 19 is an end view of the semiconductor device according to the alternative embodiment of FIG. 18.

As indicated by the dashed arrow in the flowchart of FIG. 13, steps 310 and 312 may be repeated to add additional die on top of the die stack in the same manner that die 102b was mounted atop die 102a. FIG. 14 shows one additional die 102c mounted on the die stack (without wire bonds), but the die stack may include only two die or more than three die in further embodiments. For each stacked die, the wire bonds of a die in the stack fit within the space created by the localized cavities 110 of the next die mounted thereon. Thus, the stack may include a number of die while still having a low overall height.

In the above-described embodiments, the wire bonds 130 may be uncoated gold, though it may alternatively be copper, aluminum or other metals. In a further embodiment of the present invention, the bond wires may be pre-insulated with polymeric insulation that makes the surface of the wire electrically non-conductive. Such pre-insulated bond wire would allow the wire to be pulled tight against the upper surface of the die 102 without concern of electrical shorting against the die surface. Such an embodiment would allow the localized cavities 110 to be formed with a more shallow vertical depth (as the bond wires have a low height). Two examples of a pre-insulated bond wire which is suitable for use in the present invention are disclosed in U.S. Pat. No. 5,396,104, entitled, "Resin Coated Bonding Wire, Method Of Manufacturing The Same, And Semiconductor Device," and U.S. Published Patent Application No. 2004/0124545, entitled, "High Density Integrated Circuits And The Method Of Packaging the Same," both of which are incorporated by reference herein in their entirety.

Referring now to the side view of FIG. 15, after the die stack is formed and wire bonded to bond pads on the substrate 120, the die stack may be encased within the molding compound 150 in step 316, and singulated from the panel in step 318, to form a finished semiconductor die package 160. Molding compound 150 may be a known epoxy such as for example available from Sumitomo Corp. and Nitto Denko Corp., both having headquarters in Japan. In some embodiments, the finished package 160 may optionally be enclosed within a lid in step 320.

In embodiments, the semiconductor die 102 used within package 160 may include one or more flash memory chips, and possibly a controller such as an ASIC, so that the package 160 may be used as a flash memory device. It is understood that the package 160 may include semiconductor die configured to perform other functions in further embodiments of the present invention.

It is understood that localized cavities 110 may be formed in a portion of an edge at the underside of a die 102 in a wide variety of configurations so as to provide space for a wide variety of wire bond configurations. Two such further examples are shown in FIGS. 16-19. In the top and side views of FIGS. 16 and 17, a localized cavity 110 provides space for die bond pads 104 along a first edge 140 of the die 102 to be wire bonded to contact pads 122 along a second, adjacent edge 142 of the die 102. In the top and side views of FIGS. 18 and 19, the localized cavity forms a curved tunnel having openings in the die edges 140 and 142, but formed so as to leave the corner between edges 140 and 142 intact. Such a configuration again allows die bond pads 104 along first edge 140 of the die 102 to be wire bonded to contact pads 122 along second edge 142 of the die 102. The sidewalls are shown as being curved, but it is understood that the sidewalls may be straight and extend between adjacent sides in alternative embodiments.

In the top and side views of FIGS. 20 and 21, a localized cavity 114 is not used to provide space for wire bonds, but instead provides space for a component 146, which may be a passive component or a secondary semiconductor die. The cavity 114 allows the die 102 to be positioned on the substrate directly on top of the component 146. The cavity 114 isolates the component 146 from the die 102. Such a configuration increases the flexibility of where components may be surface mounted to the substrate 120.

Up to this point, localized cavities 110 have been disclosed as being formed within a semiconductor die. In an alternative embodiment shown in FIG. 22, localized cavities 172 may instead be formed in a spacer layer 170. The spacer layer 170 is positioned between a pair of die 102a and 102b. The spacer layer 170 may be of known construction, except that one or more localized cavities 172 may be formed and provided in the layer 170 as described above. One difference between the localized cavity 172 in spacer layer 170 as compared to localized cavity 110 in die 102 is that the localized cavity 172 may be formed all the way through the thickness of the spacer layer 170 as shown in FIG. 22. Thus, for example the spacer layer 170 shown in FIG. 22 has the entire front corners removed. It is understood that the localized cavities 172 may be formed in the bottom surface of the spacer layer 170 and extend only part way through the thickness, as in localized cavities 110, in alternative embodiments.

The thickness of spacer layer 170 need only be sufficient to prevent the wire bonds 130 from die 102a from contacting the lower surface of die 102b. Given the presence of spacer layer 170, the die 102a, 102b need not include localized cavities.

In a further embodiment, the spacer layer 170 may be provided as the bottom-most layer, and include one or more localized cavities 172 for housing a surface mounted component, similar to die 102 described above with respect to FIGS. 20 and 21. The cavity 172 in this embodiment allows the spacer layer 170 to be positioned on the substrate directly on top of a surface mounted component. The cavity 172 isolates the component from the die 102 mounted thereover. Such a configuration increases the flexibility of where components may be surface mounted to the substrate. The term "bottom-most layer" as used herein may refer to either spacer layer 170 including cavities 172 mounted on substrate 120 or die 102 including cavities 114 mounted on substrate 120.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor die having a length extending between a first edge and a second edge of the die, and a width, transverse to the length, extending between a third edge and a fourth edge of the die, the semiconductor die, comprising:

an integrated circuit;
one or more die bond pads formed on an active surface of the semiconductor die adjacent the first edge; and
one or more localized cavities formed in an inactive surface of the semiconductor die, the localized cavity in a single edge of the semiconductor die extending partway along the length of the first edge and extending partway along the width dimension in a direction transverse to the first edge, the one or more localized cavities in the first edge the semiconductor die taking up less than the entire first edge of the semiconductor die, wherein a localized cavity comprises a tunnel through a bottom portion of the semiconductor die having openings on adjacent sides of the semiconductor die.

2. The semiconductor die of claim 1, wherein the positions of the one or more die bond pads on the active surface of the semiconductor die correspond to the positions of the one or more localized cavities in the inactive surface of the semiconductor die.

3. The semiconductor die of claim 1, further comprising an additional cavity, formed within the inactive surface and spaced inward from each side of the semiconductor die, for receiving a component therein.

4. The semiconductor die of claim 3, wherein the additional cavity is sized to receive the additional component therein without the additional component contacting sidewalls of the additional cavity.

5. The semiconductor die of claim 1, wherein the one or more die bond pads and one or more localized cavities are formed along a single side of the semiconductor die.

6. The semiconductor die of claim 1, wherein the one or more die bond pads and one or more localized cavities are formed along each side of the semiconductor die.

7. The semiconductor die of claim 1, wherein a localized cavity includes first and second adjacent surfaces, the first surface formed substantially parallel to the inactive surface of the semiconductor die and the second surface formed substantially perpendicularly to the inactive surface of the semiconductor die.

8. The semiconductor die of claim 1, wherein a localized cavity includes a beveled surface formed at an oblique angle to the inactive surface of the semiconductor die.

9. The semiconductor die of claim 1, wherein the tunnel includes curved sidewalls.

10. The semiconductor die of claim 1, wherein the tunnel includes straight sidewalls.

11. A semiconductor device, comprising:
a substrate including a first edge and a second edge adjacent the first edge, and the substrate including a plurality of contact pads, at least one contact pad being formed in the first edge;
a first semiconductor die mounted to the substrate, the first semiconductor die including a first side aligned with the first edge of the substrate, and the first semiconductor die including a second side adjacent the first side and aligned with the second edge of the substrate, the first semiconductor die including a plurality of bond pads positioned on a top surface of the first semiconductor die, at least one die bond pad being formed in the second side;
a second semiconductor die mounted on top of the first semiconductor die, the second semiconductor die including a plurality of bond pads positioned along one or more edges of a top surface of the second semiconductor die, and the second semiconductor die including a plurality of localized cavities in one or more edges of a bottom surface of the second semiconductor die, the one or more localized cavities in an edge together taking up less than the entire edge and the one or more localized cavities each bounded on two or three sides by the second semiconductor die in a plane parallel to the top surface of the second semiconductor die;
a first set of one or more wire bonds connected between the at least one bond pad formed in the second side of the first semiconductor die and the at least one contact pad formed in the first edge of the substrate, the first set of wire bonds positioned within the localized cavities of the second semiconductor die.

12. The semiconductor device of claim 11, further comprising a second set of wire bonds connected between the die bond pads on the top surface of the second semiconductor die and the substrate.

13. The semiconductor device of claim 11, further comprising a localized cavity formed in a bottom surface of the first semiconductor die, the localized cavity in the first semiconductor die spaced inward from each side of the first semiconductor die.

14. The semiconductor device of claim 13, further comprising a component mounted to the substrate and positioned within the localized cavity of the first semiconductor die.

15. A semiconductor device, comprising:
a substrate including a first edge and a second edge adjacent the first edge, and the substrate including a plurality of contact pads, at least one contact pad being formed in the first edge;
a first semiconductor die mounted to the substrate, the first semiconductor die including a first side aligned with the first edge of the substrate, and the first semiconductor die including a second side adjacent the first side and aligned with the second edge of the substrate, the first semiconductor die including a plurality of bond pads positioned on a top surface of the first semiconductor die, at least one die bond pad being formed in the second side;
a second semiconductor die mounted on top of the first semiconductor die, the second semiconductor die including first and second sides aligning respectively with the first and second sides of the first semiconductor die, the second semiconductor die further including a plurality of bond pads positioned along one or more edges of a top surface of the second semiconductor die, and the second semiconductor die including a localized cavity in a bottom surface of the second semiconductor die, the localized cavity defining a tunnel extending between the first and second sides of the second semiconductor die such that a corner of the second semiconductor die where the first and second sides come together remains intact;
a first set of one or more wire bonds connected between the at least one bond pad formed in the second side of the first semiconductor die and the at least one contact pad formed in the first edge of the substrate, the first set of wire bonds positioned within the localized cavity of the second semiconductor die.

16. The semiconductor device of claim 15, further comprising a second set of wire bonds connected between the die bond pads on the top surface of the second semiconductor die and the substrate.

17. The semiconductor device of claim 15, further comprising a localized cavity formed in a bottom surface of the first semiconductor die, the localized cavity in the first semiconductor die spaced inward from each side of the first semiconductor die.

18. The semiconductor device of claim 17, further comprising a component mounted to the substrate and positioned within the localized cavity of the first semiconductor die.

19. The semiconductor device of claim 15, wherein the tunnel defined by the localized cavity is curved between the first and second sides of the second semiconductor die.

20. The semiconductor device of claim 15, wherein the tunnel defined by the localized cavity extends straight between the first and second sides of the second semiconductor die.

* * * * *